United States Patent
Hu et al.

(10) Patent No.: US 10,542,627 B2
(45) Date of Patent: Jan. 21, 2020

(54) METHOD FOR MANUFACTURING A FLEXIBLE PRINTED CIRCUIT BOARD

(71) Applicants: HongQiSheng Precision Electronics (QinHuangDao) Co., Ltd., Qinhuangdao (CN); Avary Holding (Shenzhen) Co., Limited., Shenzhen (CN)

(72) Inventors: Xian-Qin Hu, Qinhuangdao (CN); Cheng-Jia Li, Qinhuangdao (CN)

(73) Assignees: HongQiSheng Precision Electronics (QinHuangDao) Co., Ltd., Qinhuangdao (CN); Avary Holding (Shenzhen) Co., Limited., Shenzhen (CN)

( * ) Notice: Subject to any disclaimer, the term of this patent is extended or adjusted under 35 U.S.C. 154(b) by 0 days.

(21) Appl. No.: 16/051,107

(22) Filed: Jul. 31, 2018

(65) Prior Publication Data

US 2019/0116674 A1    Apr. 18, 2019

(30) Foreign Application Priority Data

Oct. 12, 2017   (CN) .......................... 2017 1 0949319

(51) Int. Cl.
| | | |
|---|---|---|
| H05K 3/18 | (2006.01) | |
| H05K 1/18 | (2006.01) | |
| H05K 3/28 | (2006.01) | |
| H05K 3/00 | (2006.01) | |
| H05K 3/46 | (2006.01) | |

(52) U.S. Cl.
CPC ............. *H05K 3/182* (2013.01); *H05K 1/189* (2013.01); *H05K 3/0017* (2013.01); *H05K 3/287* (2013.01); *H05K 3/4661* (2013.01)

(58) Field of Classification Search
CPC ...... H05K 1/189; H05K 3/0017; H05K 3/182; H05K 3/287; H05K 3/4561
See application file for complete search history.

(56) References Cited

U.S. PATENT DOCUMENTS

| | | | | |
|---|---|---|---|---|
| 8,586,875 | B2 * | 11/2013 | Morita ................. | H05K 1/0222 172/262 |
| 2011/0209904 | A1 * | 9/2011 | Ishida .................. | H05K 1/0222 174/257 |
| 2011/0209905 | A1 * | 9/2011 | Morita ................. | H05K 1/0222 174/257 |
| 2012/0247813 | A1 * | 10/2012 | Ueda ................. | H01L 23/49816 174/251 |

(Continued)

FOREIGN PATENT DOCUMENTS

TW            201112892            4/2011

*Primary Examiner* — Carl J Arbes
(74) *Attorney, Agent, or Firm* — ScienBiziP, P.C.

(57) ABSTRACT

A method for manufacturing a flexible printed circuit board includes having a base layer, and creating a pattern line and at least one conductive pole. The base layer defines at least one communication hole penetrating through the base layer. The pattern line includes two conductive circuit layers formed on opposite surfaces of the base layer. The at least one conductive pole is formed in the at least one communication hole and electrically connects the two conductive circuit layers. A diameter of each conductive pole is less than a diameter of a communication hole.

18 Claims, 8 Drawing Sheets

(56) References Cited

U.S. PATENT DOCUMENTS

2012/0250281 A1* 10/2012 Kawai .................... H05K 3/427
                                                    361/774
2012/0307470 A1* 12/2012 Arai ......................... H05K 7/06
                                                    361/783

* cited by examiner

METHOD FOR MANUFACTURING A FLEXIBLE PRINTED CIRCUIT BOARD

FIELD

The subject matter herein generally relates to a flexible printed circuit board (FPCB) and a method for manufacturing the FPCB.

BACKGROUND

FPCBs define holes to receive conductive posts. The conductive post electrically connects to other electrical element by a pad. To make a good contact between the conductive post and the pad, the FPCB further defines ring holes communicating with the receiving holes. An outer diameter of the ring hole is greater than a diameter of the receiving hole, causing layout problems on the FPCB.

Accordingly, there is room for improvement within the art.

BRIEF DESCRIPTION OF THE DRAWINGS

Implementations of the present technology will now be described, by way of example only, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

Referring to FIGS. 1 to 8, a method for making a FPCB 100 is presented in a first embodiment. The method for making the FPCB 100 is provided by way of example, as there are a variety of ways to carry out the method. The method can begin at step 1.

Figure 1:
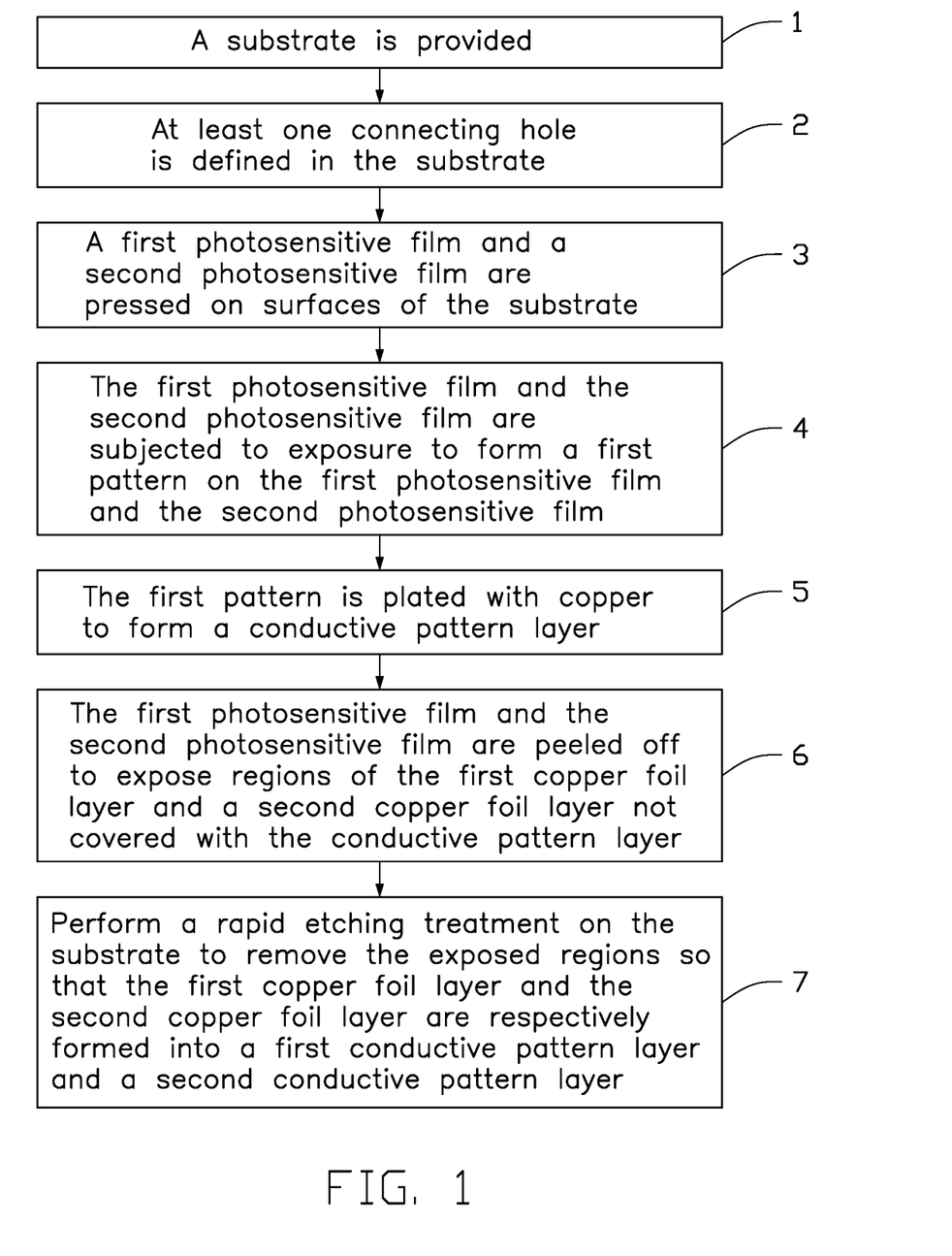
FIG. 1 is a flowchart of an exemplary embodiment of a method for manufacturing a FPCB.
Figure 2:
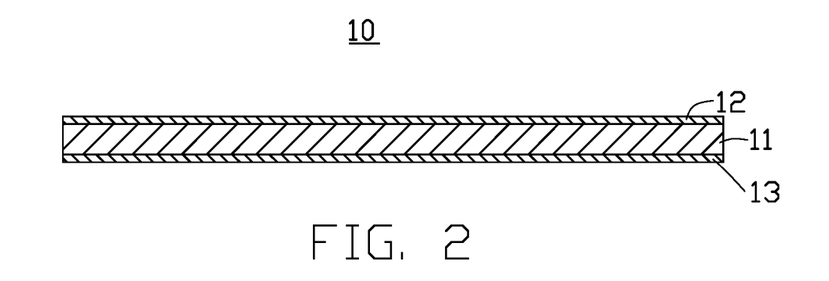
FIG. 2 is a diagram of an embodiment of a substrate.

At step 1, referring to FIGS. 1 and 2, a substrate 10 is provided. The substrate 10 includes a base layer 11 having two opposite surfaces and a first copper foil layer 12 is formed on one surface and a second copper foil layer 13 is formed on the opposite surface of the base layer 11.

In at least one embodiment, the base layer 11 is made of a polymer selected from a group consisting of polyimide, polyethylene terephthalate, and polyethylene naphthalate, and any combination thereof.

Figure 3:
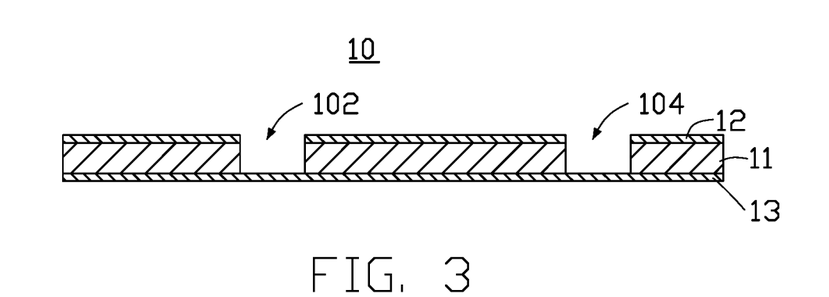
FIG. 3 is a diagram showing at least one connecting hole defined in the substrate of FIG. 2.

At step 2, referring to FIGS. 1 and 3, at least one connecting hole 102 is defined in the substrate 10.

In at least one embodiment, the substrate 10 defines two connecting holes 102. Each connecting hole 102 penetrates only the first copper foil layer 12 and the base layer 11. Each connecting hole 102 can be created using a laser. The connecting hole 102 includes a communication hole 104 penetrating the first copper foil layer 12. In another embodiment, each connecting hole 102 penetrates only the second copper foil layer 13 and the base layer 11. Each connecting hole 102 is mechanically cut.

Figure 4:
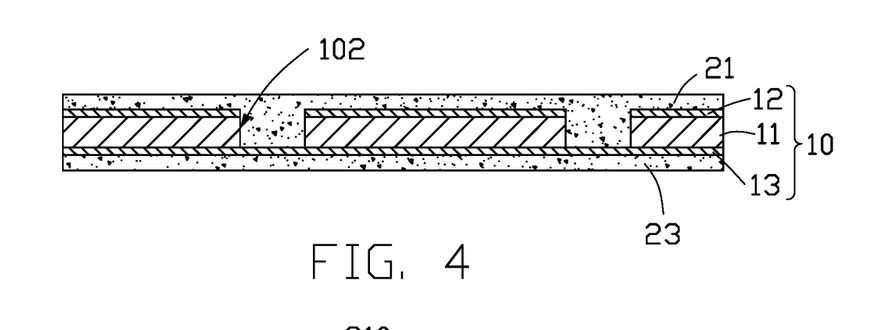
FIG. 4 is a diagram showing a first photosensitive film and a second photosensitive film on opposite surfaces of the substrate of FIG. 3.

At step 3, referring to FIGS. 1 and 4, a first photosensitive film 21 and a second photosensitive film 23 are pressed on surfaces of the substrate 10. The first photosensitive film 21 covers the first copper foil layer 12 and fills the connection hole 102. The second photosensitive film 23 covers the second copper foil layer 13.

Figure 5:
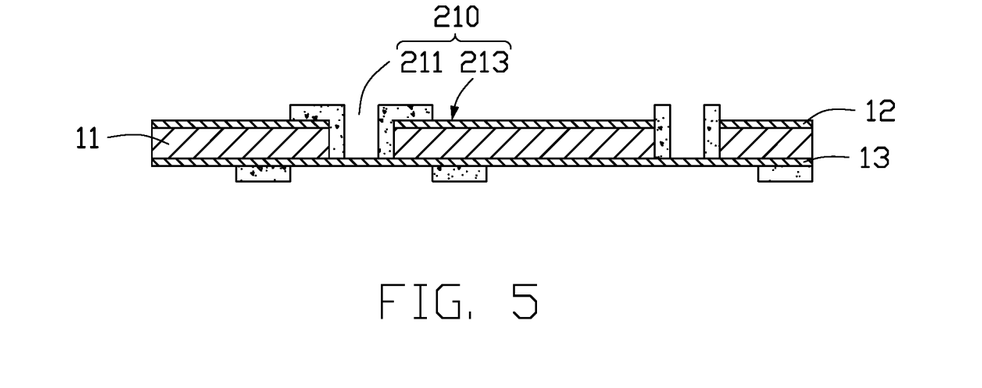
FIG. 5 is a diagram showing the first photosensitive film and the second photosensitive film of FIG. 4 subjected to exposure and development.

At step 4, referring to FIGS. 1 and 5, the first photosensitive film 21 and the second photosensitive film 23 are subjected to exposure to form a first pattern 210 on the first photosensitive film 21 and the second photosensitive film 23. The first pattern 210 includes a positioning via 211 corresponding to the connecting hole 102 that exposes the second copper foil layer 13. An axis line of the positioning via 211 coincides with an axis line of the connecting hole 102. A diameter of the positioning via 211 is less than a diameter of the connecting hole 102. The first pattern 210 further includes a line pattern 213. The line pattern 213 is formed on the second photosensitive film 23 and on the photosensitive film 21 beside the positioning via 211.

Figure 6:
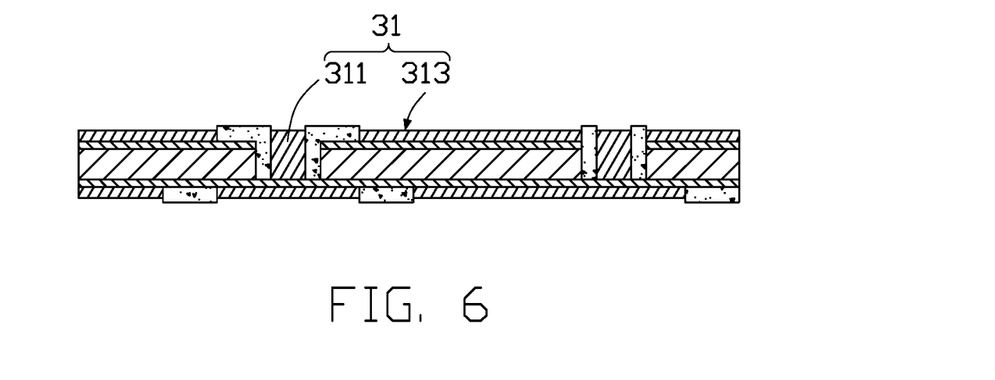
FIG. 6 is a diagram showing a conductive pattern layer formed on the substrate of FIG. 5.

At step 5, referring to FIGS. 1 and 6, the first pattern 210 is plated with copper to form a conductive pattern layer 31.

The conductive pattern layer 31 includes a conductive pole 311 infilling the positioning via 211. The conductive pattern layer 31 further includes a first pattern line 313 formed on a surface of the first copper foil layer 12 away from the base layer 11 and a surface of the second copper foil layer 13 away from the base layer 11. The first pattern line 313 is corresponding to the line pattern 213.

Figure 7:
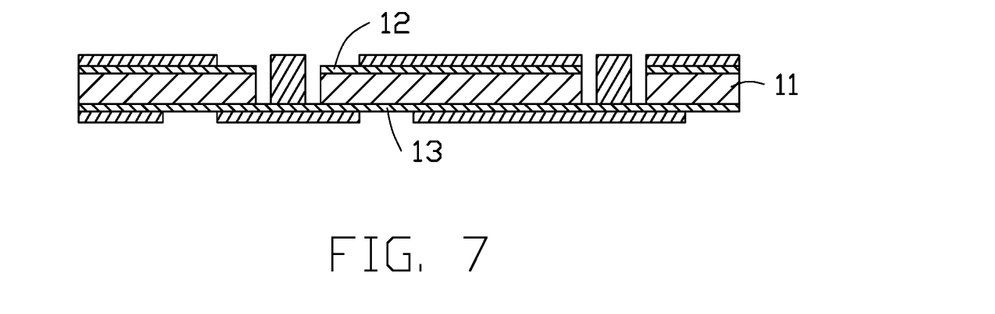
FIG. 7 is a diagram showing the first photosensitive film and the second photosensitive film of FIG. 6 peeled off.

At step 6, referring to FIGS. 1 and 7, the first photosensitive film 21 and the second photosensitive film 23 are peeled off to expose regions of the first copper foil layer 12 and a second copper foil layer 13 not covered with the conductive pattern layer 31.

Figure 8:
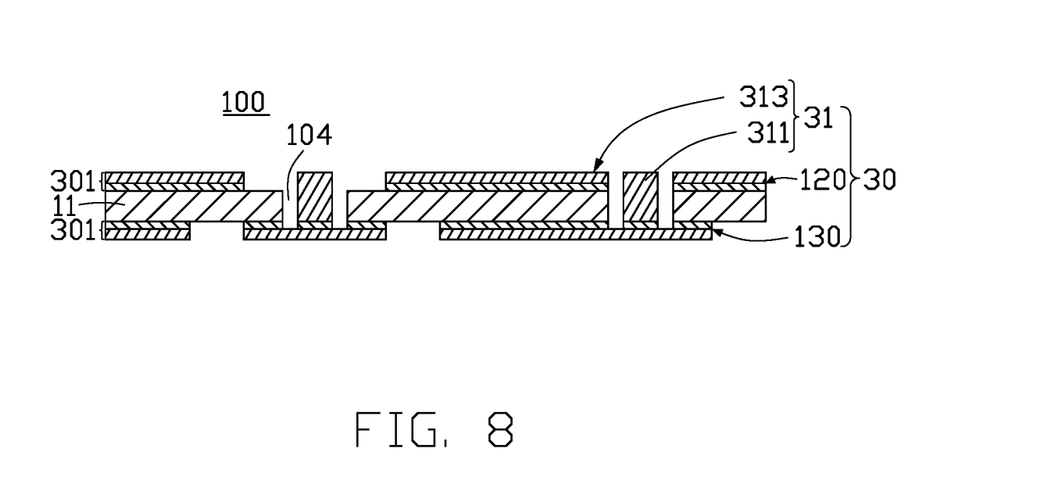
FIG. 8 is a diagram showing the substrate of FIG. 7 after a etching treatment.

At step 7, referring to FIGS. 1 and 8, perform a rapid etching treatment on the substrate 10 to remove the exposed regions so that the first copper foil layer 12 and the second copper foil layer 13 are respectively formed into a first conductive pattern layer 120 and a second conductive pattern layer 130. The rapid etching treatment etches only in a lamination direction of copper layers of the substrate 10. The first conductive pattern layer 120, the second conductive pattern layer 130, and the conductive pattern layer 31 form a pattern line 30. That is, the pattern line 30 includes two conductive circuit layers 301 on opposite surfaces of the base layer 11 and the conductive poles 311. The conductive poles 311 are used to electrically connect the two conductive circuit layers 301. One conductive circuit layer 301 is composed of a first conductive pattern layer 120 and a first pattern line 313 covering the first conductive pattern layer 120, and another conductive pattern layer 130 and a first pattern line 313 cover the second conductive pattern layer 130.

In another embodiment, before defining the connection hole 102 on the substrate 10, the copper subtract can be subjected to a thinning process as needed to render a uniform thickness to the first bottom copper layer 12 and to the second bottom copper layer 13.

In another embodiment, a cover film (not shown) is formed on the pattern line 30 and the base layer 11, and the cover film fills the communication hole 104.

Referring to FIG. 8, the FPCB 100 manufactured by the method above includes the base layer 11 and the pattern line 30. The base layer 11 defines at least one communication hole 104 penetrating opposite surfaces of the base layer 11. The pattern line 30 includes two conductive circuit layers 301 formed on opposite surfaces of the base layer 11, and the conductive pole 311 formed in the communication holes 104 which electrically connects the two conductive circuit layers 301. The diameter of the conductive pole 311 is smaller than the diameter of the communication hole 104.

Referring to FIGS. 8 to 16, in another embodiment, the method further includes following steps.

Figure 9A:
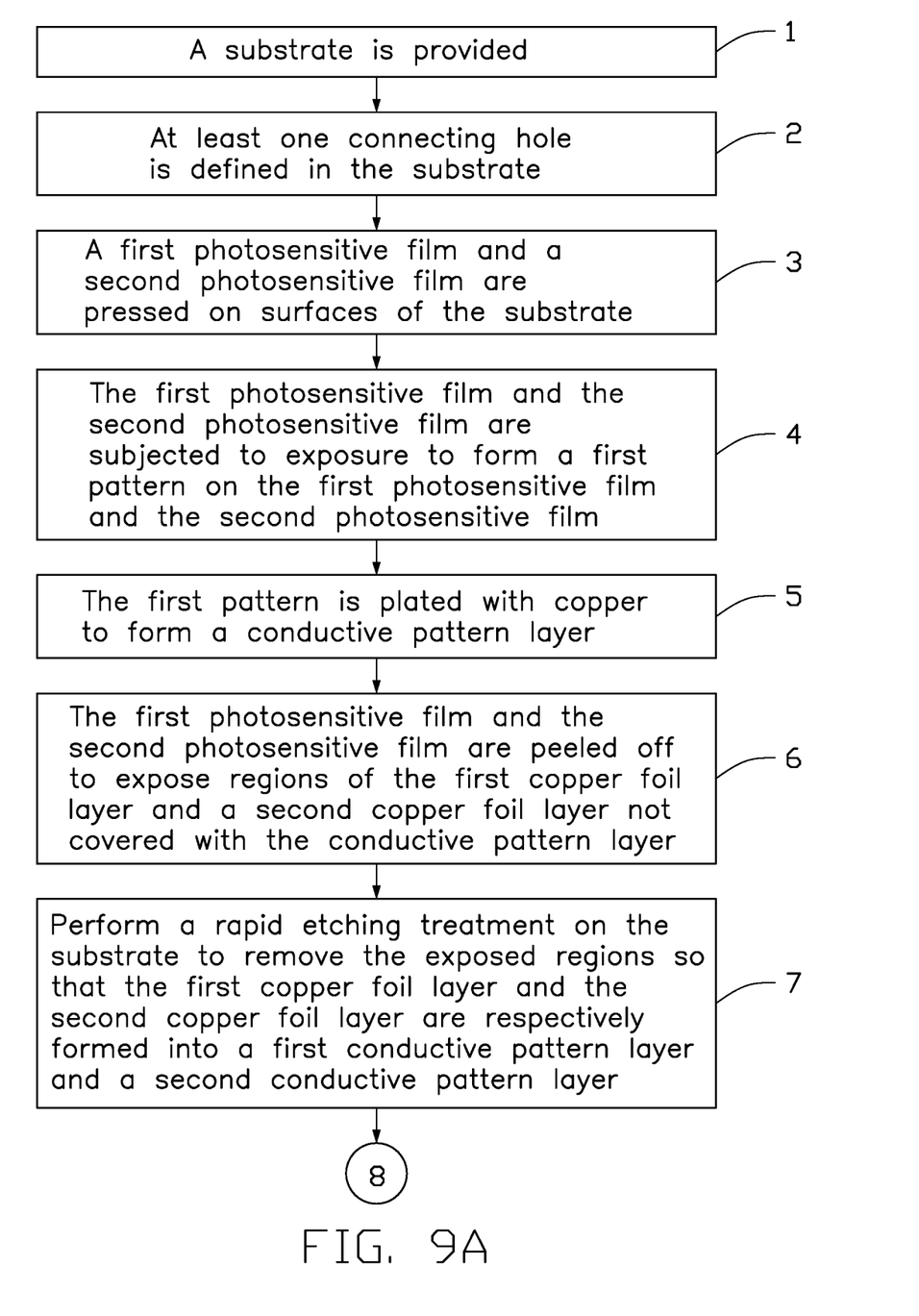
FIGS. 9A and 9B is a flowchart of another embodiment of a method for manufacturing a FPCB.
Figure 9B:
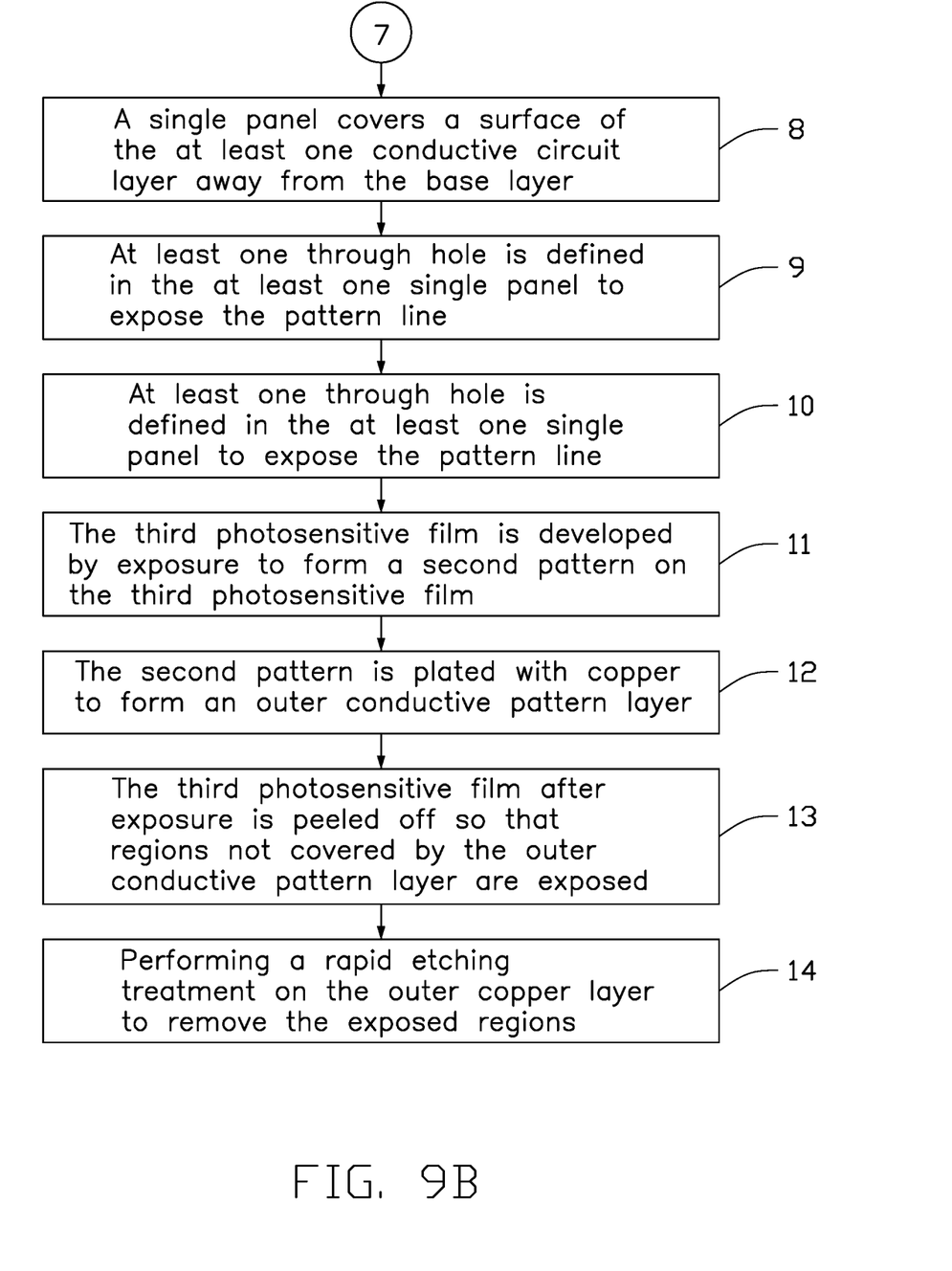
Figure 10:
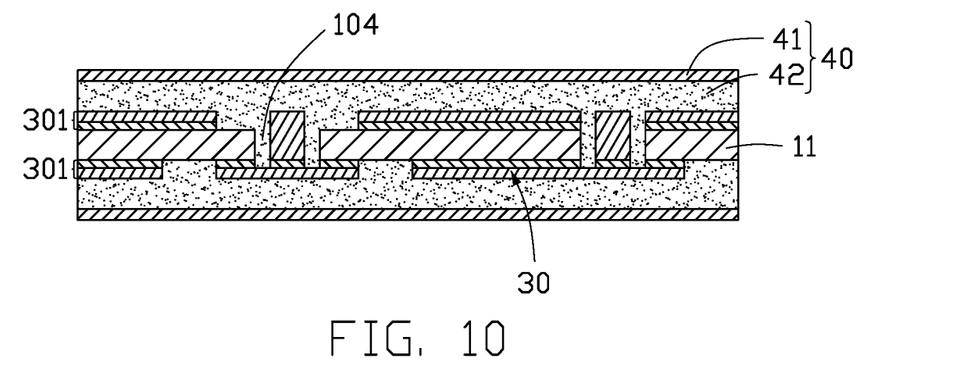
FIG. 10 is a diagram showing two single panels covering the surface of the two conductive circuit layers of FIG. 8.

At step 8, referring to FIGS. 9 and 10, a single panel 40 covers a surface of the at least one conductive circuit layer 301 away from the base layer 11.

In this embodiment, a single panel 40 covers each of the surfaces of the two conductive circuit layers 301 away from the base layer 11. Each single panel 40 includes an outer copper layer 41 and an adhesive layer 42 adhered between the outer copper layer 41 and the conductive circuit layers 301. The adhesive layer 42 covers the pattern line 30 and the base layer 11, and infills the communication hole 104.

Figure 11:
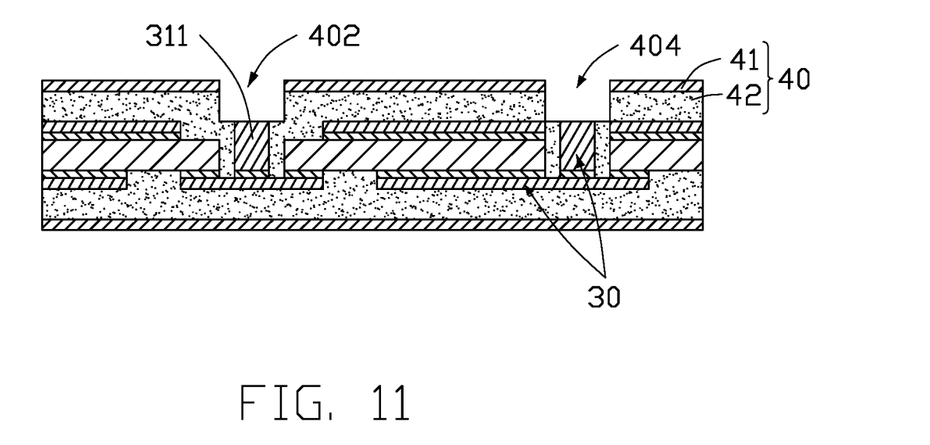
FIG. 11 is a diagram showing through holes defined in the single panels of FIG. 10.

At step 9, referring to FIGS. 9 and 11, at least one through hole 402 is defined in the at least one single panel 40 to expose the pattern line 30. The through hole 402 includes a through hole 404 penetrating the adhesive layer 42.

In this embodiment, the through hole 402 is formed on the single panel 40 adjacent to the first conductive pattern layer 120 corresponding to the conductive pole 311. The through hole 402 exposes the conductive pole 311. The through hole 402 can be created using a laser.

In another embodiment, the through hole 402 is defined in the pattern line 30 except for the conductive pole 311. The through hole 402 is formed by other processing methods, such as being mechanically cut.

Figure 12:
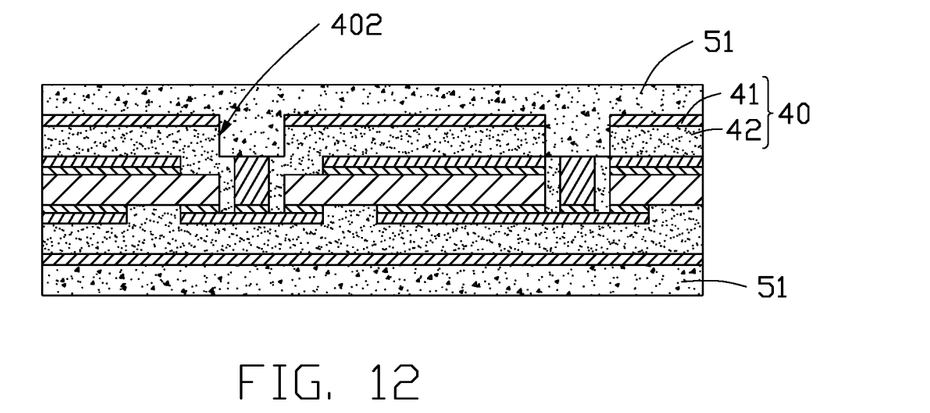
FIG. 12 is a diagram showing a third photosensitive film on a side of the single panel of FIG. 11.

At step 10, referring to FIGS. 9 and 12, a third photosensitive film 51 is pressed on a side of the single panel 40 away from the substrate 10. The through hole 402 is infilled by the third photosensitive film 51.

Figure 13:
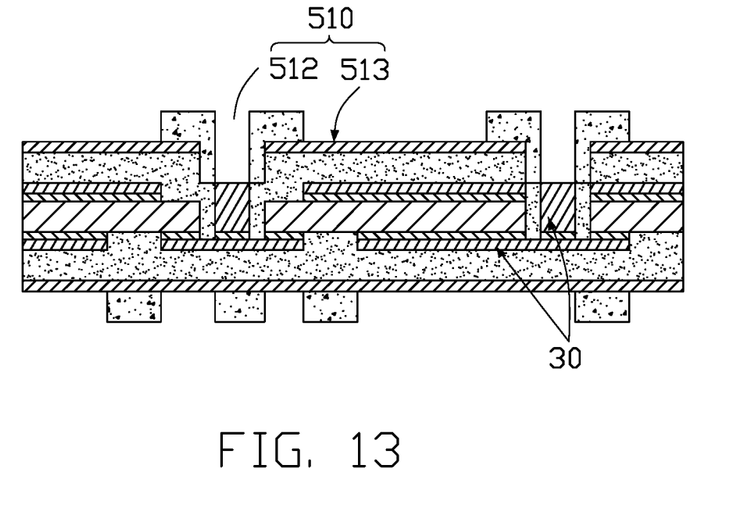
FIG. 13 is a diagram showing the third photosensitive film of FIG. 11 subjected to exposure and development.

At step 11, referring to FIGS. 9 and 13, the third photosensitive film 51 is developed by exposure to form a second pattern 510 on the third photosensitive film 51. The second pattern 510 includes a hole 512 corresponding to the through hole 402. A diameter of the hole 512 is smaller than a diameter of the through hole 402.

The second pattern 510 further includes a line pattern 513. The line pattern 213 is formed on the third photosensitive film 51 beside the hole 512.

Figure 14:
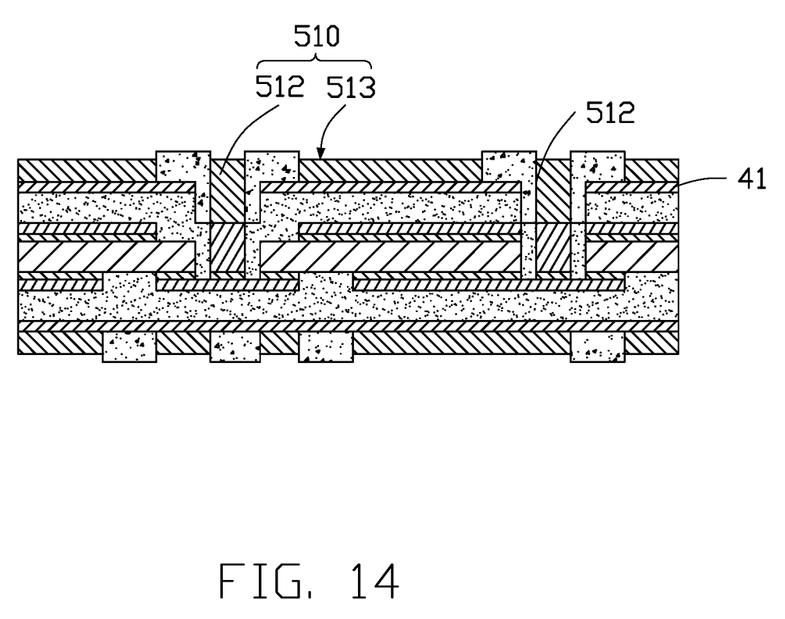
FIG. 14 is a diagram showing an outer conductive pattern layer formed on the single panel of FIG. 12.

At step 12, referring to FIGS. 9 and 14, the second pattern 510 is plated with copper to form an outer conductive pattern layer 61. The outer conductive pattern layer 61 includes a conductive post 611 infilled in the hole 512. The outer conductive pattern layer 61 further includes a second pattern line 613 formed on a surface of the outer copper layer 41 away from the adhesive layer 42. In this embodiment, the second pattern line 613 corresponds to the line pattern 513. The conductive post 611 is aligned with the conductive pole 311.

Figure 15:
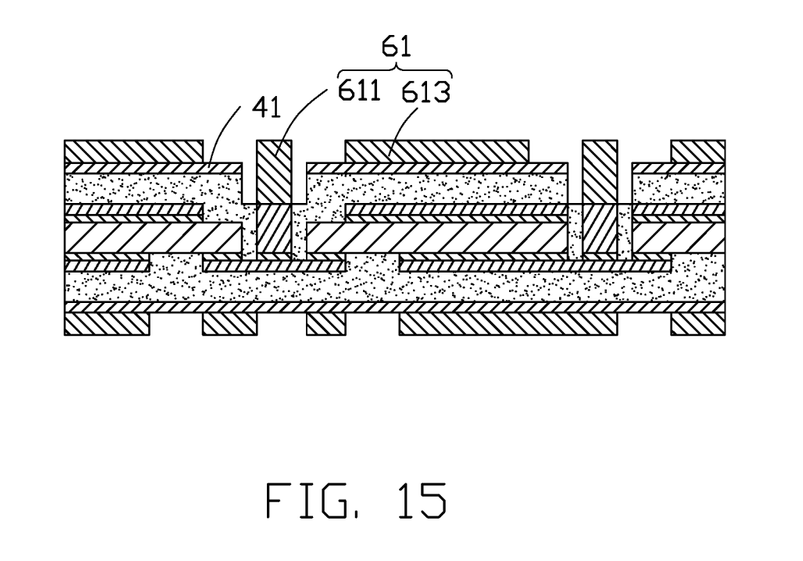
FIG. 15 is a diagram showing the third photosensitive film of FIG. 13 peeled off.

At step 13, referring to FIGS. 9 and 15, the third photosensitive film 51 after exposure is peeled off so that regions not covered by the outer conductive pattern layer 61 are exposed.

Figure 16:
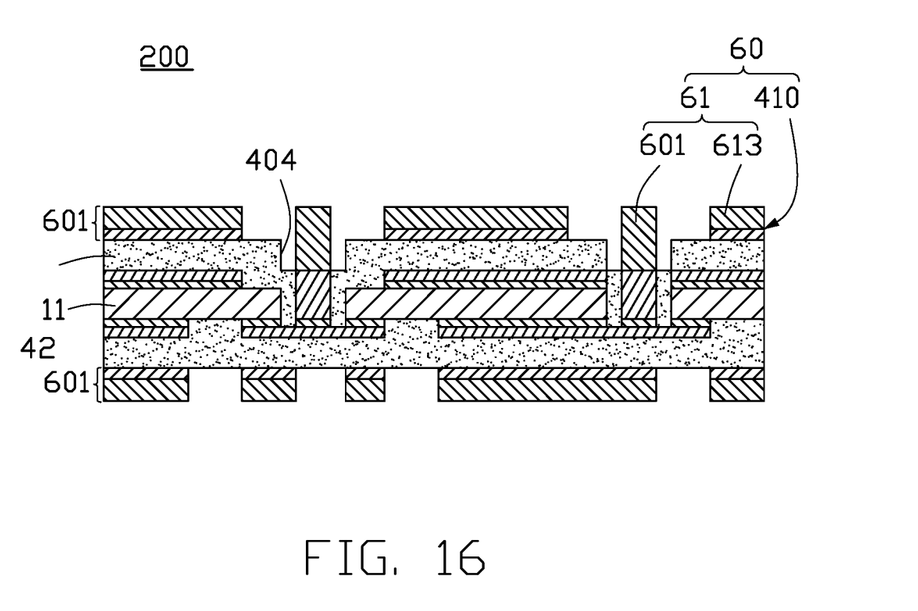
FIG. 16 is a diagram showing the outer copper layer of FIG. 14 after a etching treatment.

At step 14, referring to FIGS. 9 and 16, performing a rapid etching treatment on the outer copper layer 41 to remove the exposed regions. The outer copper layer 41 is thus formed into a third conductive pattern layer 410 corresponding to the outer conductive pattern layer 61, and thereby the FPCB 200 is formed. The graphics layer 410 is used to fabricate the FPCB 200. The third conductive pattern layer 410 and the second pattern line 613 constitute an outer conductive layer 601. The outer conductive layer 601 and the conductive post 611 constitute an outer pattern line 60.

In another embodiment, a cover film (not shown) is formed on the pattern line 60 and the adhesive layer 42, and the cover film infills the through hole 404.

Steps 10-16 can be repeated to obtain a FPCB having additional layers.

Referring to FIG. 16, the FPCB 200 is manufactured by the methods above. The FPCB 200 further includes one or two adhesive layers 42 and the outer pattern line 60. Each adhesive layer 42 covers one side of the pattern line 30 and the base layer 11 on the same side that is not covered by the pattern line 30. At least one adhesive layer 42 defines at least one through hole 404, penetrating the adhesive layer 42, to expose the pattern line 30. The outer pattern line 60 includes an outer conductive layer 601 formed on a surface of the adhesive layer 42 away from the base layer 11, and the conductive post 611 formed in the through hole 404 which electrically connects the outer conductive layer 601 to the pattern line 30. The diameter of the conductive post 611 is less than the diameter of the through hole 404.

Even though information and advantages of the present embodiments have been set forth in the foregoing description, together with details of the structures and functions of the present embodiments, the disclosure is illustrative only.

Changes may be made in detail, especially in matters of shape, size, and arrangement of parts within the principles of the present embodiments to the full extent indicated by the plain meaning of the terms in which the appended claims are expressed.

What is claimed is:

1. A method for making a flexible printed circuit board comprising:

provdiing a flexible substrate, the flexible substrate comprising a base layer and a first copper foil layer and a second copper foil layer both formed on opposite surfaces of the base layer;

defining at least one connecting hole in the flexible substrate, each connecting hole penetrating the first copper foil layer and the base layer;

forming a conductive pattern layer on the flexible substrate through plating with copper, the conductive pattern layer comprising a conductive pole filled in the connecting hole and a pattern line formed on a surface of the first copper foil layer away from the base layer and a surface of the second copper foil layer away from the base layer, one end of each conductive pole being positioned on a surface of the second copper foil layer facing the base layer, and the conductive poles electrically connecting the first copper foil layer and a second copper foil layer, a diameter of the conductive pole being smaller than a diameter of the connecting hole; and performing an etching treatment on the flexible substrate to remove regions where the first copper foil layer and a second copper foil layer are not covered with the conductive pattern layer to respectively form the first copper foil layer and the second copper foil layer into a first conductive pattern layer and a second conductive pattern layer.

2. The method of claim 1, wherein the step of forming the conductive pattern layer comprises:

pressing a first photosensitive film and a second photosensitive film on the first copper foil layer and the second copper foil layer, the first photosensitive film filling the connection hole;

performing exposure development on the first photosensitive film to form a first pattern on the first photosensitive film and the second photosensitive film, the first pattern comprises a positioning via corresponding to the connecting hole so that expose the second copper foil layer, a diameter of the positioning via being less than a diameter of the connecting hole, the first pattern further comprising a line pattern formed on the second photosensitive film and positions of the photosensitive film besides the positioning via;

plating with copper on the first pattern to form the conductive pattern layer; and peeling off the first photosensitive film and the second photosensitive film.

3. The method of claim 2, wherein an axis line of the positioning via coincides with an axis line of the connecting hole.

4. The method of claim 1, wherein the etching treatment etches in a lamination direction of copper layers of the flexible substrate.

5. The method of claim 1, further comprising:

covering at least one side of the pattern line away from the base layer with a single panel, each single panel comprising an outer copper layer and an adhesive layer adhered between the outer copper layer and the pattern line;

defining at least one through hole in the at least one single panel to expose the pattern line;

forming an outer conductive pattern layer through plating with copper on the single panel, the outer conductive pattern layer comprising a conductive post filled in the hole and a pattern line formed on a surface of the outer copper layer away from the adhesive layer; and performing a etching treatment on the outer copper layer to remove regions where the outer copper layer is not covered with the outer conductive pattern layer.

6. The method of claim 5, wherein the step of forming an outer conductive pattern layer comprises:

pressing a third photosensitive film on the single panel, the first photosensitive film filling the though hole;

performing exposure development on the second photosensitive film to form a second pattern on the third photosensitive film, the second pattern comprises a hole corresponding to the though hole so that expose the conductive pattern layer, a diameter of the hole being less than a diameter of the though hole, the second pattern further comprising a line pattern formed on positions of the third photosensitive film besides the hole;

plating with copper on the second pattern to form the out conductive pattern layer; and peeling off the third photosensitive film.

7. The method of claim 5, wherein the conductive post is aligned with the conductive pole.

8. The method of claim 7, wherein the through hole is formed by being mechanically cut.

9. The method of claim 7, wherein through hole is created using a laser.

10. A method for making a conductive pattern layer comprising:

providing a flexible substrate, the flexible substrate comprising a base layer, a first copper foil layer and a second copper foil layer, the first and the second copper foil layers being formed on opposite surfaces of the base layer;

defining at least one connecting hole in the flexible substrate, each of the connecting hole penetrating the first copper foil layer and the base layer;

forming a conductive pattern layer on the flexible substrate by plating with copper, the conductive pattern layer comprising a conductive pole filled in the connecting hole and a pattern line formed on a surface of the first copper foil layer away from the base layer and a surface of the second copper foil layer away from the base layer, one end of the conductive pole being positioned on a surface of the second copper foil layer facing the base layer, and the conductive pole electrically connecting the first copper foil layer and a second copper foil layer, a diameter of the conductive pole being smaller than a diameter of the connecting hole; and performing an etching treatment on the flexible substrate to remove regions where the first copper foil layer and a second copper foil layer are not covered with the conductive pattern layer so as to respectively form the first copper foil layer and the second copper foil layer into a first conductive pattern layer and a second conductive pattern layer.

11. The method of claim 10, wherein the step of forming the conductive pattern layer comprises:

pressing a first photosensitive film and a second photosensitive film on the first copper foil layer and the second copper foil layer, the first photosensitive film filling the connection hole;

performing exposure development on the first photosensitive film to form a first pattern on the first photosensitive film and the second photosensitive film, the first pattern comprising a positioning via corresponding to the connecting hole so that the second copper foil layer is exposed, a diameter of the positioning via being less than a diameter of the connecting hole, the first pattern further comprising a line pattern formed on the second photosensitive film and positions of the photosensitive film besides the positioning via;

plating with copper on the first pattern to form the conductive pattern layer; and peeling off the first photosensitive film and the second photosensitive film.

12. The method of claim 11, wherein an axis line of the positioning via coincides with an axis line of the connecting hole.

13. The method of claim 10, wherein the etching treatment etches in a lamination direction of copper layers of the flexible substrate.

14. The method of claim 10, further comprising:

covering at least one side of the pattern line away from the base layer with a single panel, each single panel comprising an outer copper layer and an adhesive layer between the outer copper layer and the pattern line;

defining at least one through hole in the at least one single panel to expose the pattern line;

forming an outer conductive pattern layer through plating with copper on the single panel, the outer conductive pattern layer comprising a conductive post filled in the hole and a pattern line formed on a surface of the outer copper layer away from the adhesive layer; and performing an etching treatment on the outer copper layer to remove regions where the outer copper layer is not covered with the outer conductive pattern layer.

15. The method of claim 14, wherein the step of forming an outer conductive pattern layer comprises:

pressing a third photosensitive film on the single panel, the first photosensitive film filling the though hole;

performing exposure development on the second photosensitive film to form a second pattern on the third photosensitive film, the second pattern comprises a hole corresponding to the though hole so that the conductive pattern layer is exposed, a diameter of the hole being less than a diameter of the though hole, the second pattern further comprising a line pattern formed on positions of the third photosensitive film besides the hole;

plating with copper on the second pattern to form the outer conductive pattern layer; and peeling off the third photosensitive film.

16. The method of claim 14, wherein the conductive post is aligned with the conductive pole.

17. The method of claim 16, wherein the through hole is formed by being mechanically cut.

18. The method of claim 16, wherein through hole is created using a laser.

* * * * *